United States Patent
Schauer et al.

(10) Patent No.: US 8,818,271 B2
(45) Date of Patent: Aug. 26, 2014

(54) OFFSET CANCELLATION FOR DC ISOLATED NODES

(71) Applicant: Oracle International Corporation, Redwood City, CA (US)

(72) Inventors: Justin M. Schauer, San Francisco, CA (US); Robert David Hopkins, II, Foster City, CA (US); Robert J. Drost, Los Altos, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/101,015

(22) Filed: Dec. 9, 2013

(65) Prior Publication Data

US 2014/0099892 A1     Apr. 10, 2014

Related U.S. Application Data

(63) Continuation of application No. 12/349,011, filed on Jan. 6, 2009, now Pat. No. 8,644,759.

(51) Int. Cl.
   *H04B 5/00*     (2006.01)

(52) U.S. Cl.
   USPC .......................................... 455/41.1

(58) Field of Classification Search
   USPC .......................................... 455/41.1
   See application file for complete search history.

(56) References Cited

U.S. PATENT DOCUMENTS

| | | | | |
|---|---|---|---|---|
| 4,935,702 A | * | 6/1990 | Mead et al. | 365/185.32 |
| 5,049,758 A | * | 9/1991 | Mead et al. | 365/185.21 |
| 5,068,622 A | * | 11/1991 | Mead et al. | 330/253 |
| 5,073,759 A | * | 12/1991 | Mead et al. | 330/288 |
| 5,109,261 A | * | 4/1992 | Mead et al. | 257/369 |

* cited by examiner

*Primary Examiner* — April G Gonzales
(74) *Attorney, Agent, or Firm* — Park, Vaughan, Fleming & Dowler LLP

(57) ABSTRACT

Offset voltages developed on floating nodes on inputs to high-performance amplifiers that are DC isolated from the data signals input to amplifiers are cancelled by connecting a highly resistive element between the input node and a predetermined potential, particularly useful in proximity communication systems in which two chips are connected through capacitive or inductive coupling circuits formed jointly in the two chips. The resistive element may be an off MOS transistor connected between the node and a desired bias voltage or a MOS transistor with its gate and drain connected to the potential. Multiple bias voltages may be distributed to all receivers and locally selected by a multiplexer for application to one or two input nodes of the receiver. The receiver output can also serve as a predetermined potential when the resistive element has a long time constant compared to the data rate or the resistive element is non-linear.

6 Claims, 5 Drawing Sheets

OFFSET CANCELLATION FOR DC ISOLATED NODES

RELATED APPLICATION

This application is a continuation application of, and hereby claims priority under 35 U.S.C. §120 to, pending U.S. patent application Ser. No. 12/349,011, entitled "Offset Cancellation for DC Isolated Nodes," by inventors Justin M. Schauer, Robert David Hopkins Robert J. Drost filed on 6 Jan. 2009.

BACKGROUND

1. Field of the Invention

The present invention relates to biasing techniques in integrated circuit (IC) chips. In particular, the invention relates to biasing a floating node in a system that supports proximity communication.

2. Related Art

Advances in semiconductor technology presently make it possible to integrate large-scale systems, including hundreds of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

However, these semiconductor chips still need to communicate with each other, and unfortunately these advances in semiconductor technology have not been matched by corresponding advances in inter-chip communication technology. Semiconductor chips are typically integrated onto a printed circuit board that contains multiple layers of signal lines for inter-chip communication. However, signal lines are typically 100 to 1000 times denser on a semiconductor chip than on a printed circuit board. Consequently, only a tiny fraction of the signal lines on a semiconductor chip can be routed across the printed circuit board to other chips. This problem is creating a bottleneck that is expected to worsen as semiconductor integration densities continue to increase.

One solution to the above problem is to replace the direct conductive coupling with direct chip-to-chip capacitive coupling, referred to as "proximity communication." Proximity communication is an I/O technology that allows two chips in face-to-face alignment to communicate without wires as has been explained by Drost et al. in "Proximity Communication," IEEE Journal of Solid-State Circuits, vol. 39, no. 9, September 2004, pp. 1529-1535. In the most widely used implementation, corresponding arrays of electrode plates or pads are formed in the opposing surfaces of the two chips, which are then fixed together with a dielectric layer in between to form a large number of capacitively coupled communication links between the chips. One embodiment of a capacitively coupled communication system is illustrated in the circuit diagram of FIG. 1. A first integrated circuit chip, here called a transmit chip 10, includes a transmitter 12 as well as other integrated circuitry typical of a modern IC. A second integrated circuit chip, here called a receive chip 14, includes a receiver 16 as well as other integrated circuitry which needs to be coupled to the circuitry of the transmit chip 10. In this embodiment, the transmitter 12 and receivers 16 are differential, each having two inputs and two outputs for usually complementary versions of the same signal. Conductive transmit pads 18A, 18B are formed in the surface of the transmit chip 10 and are connected to the differential outputs of the transmitter 12 receiving an input signal $V_{IN}$ across its differential inputs. Similarly, conductive receive pads 20A, 20B are formed in the surface of the receive chip 14 in positions to be aligned with the transmit pads 18A, 18B of the transmit chip 10. The receive pads 20A, 20B are connected to the differential inputs of the receiver 16 outputting on its differential outputs an output signal $V_{OUT}$, which should correspond to $V_{IN}$.

Typically the pads 18A, 18B, 20A, 20B are covered with thin dielectric layers as part of their formation process. To achieve a proximity communication system, the transmit and receive chips 10, 14 are permanently or semi-permanently juxtaposed with the transmit pads 18A, 18B aligned with respective ones of the receive pads, 20B with a dielectric layer between them, thereby forming two capacitive coupling circuits 22, 24 between the two chips 10, 14 for the differential signal to be coupled between them.

However, the capacitive coupling circuits 22, 24 provide DC isolation between the two chips 10, 14 and the high input impedance of the differential amplifier of the receiver 16 provides very little conductive discharge to ground or other predetermined voltage. As a result, receiver nodes 26, 28 receiving the capacitively coupled signals are floating relative to the transmit chip 10 and not DC tied to the outputs of the transmitter 10. As a result, the receiver nodes 26, 28 may suffer DC wander due to leakage, and the input offset voltage of the receiver 16 subtracts from any signal coupled across the capacitors 22, 24.

In an alternative inductively coupled proximity communication system illustrated in the circuit diagram of FIG. 2, inductors 30, 34 are formed at the surfaces of the two chips 10, 14 and are covered with a thin dielectric layer. The transmit inductor 30 is connected across the differential outputs of the transmitter 12 and the receive inductor 32 is connected across the differential inputs of the receiver 16. When the two chips 10, 14 are juxtaposed with the two inductors 30, 32 in alignment, an inductive coupling circuit is formed between the two chips 10, 14. In the inductively coupled system, the receive nodes 26, 28 are also floating.

In either the capacitive or inductive proximity system, differential transmitters and receivers may be replaced by non-differential active elements having only a single input and single output. Thereby, one of the capacitive coupling circuits may be eliminated or the inductors have grounded ends. However, the differential implementations are preferred for the low signal levels inherent in proximity communication. Nonetheless, the single receive node remains floating unless counteracting measures are adopted.

Proximity communication involves integrating arrays of capacitive (or inductive) coupling circuits and associated transmitters and receivers onto semiconductor chips to facilitate inter-chip communication. The signal flow may be bi-directional so that transmitters and receivers formed in each chip and associated transmit and receive pads are formed in different surface areas of the chip. If a first chip is situated face-to-face with a second chip so that transmitter pads on the first chip are capacitively coupled via a coupling capacitor with receiver pads on the second chip, it becomes possible to transmit electrical signals directly from the first chip to the second chip without having to route the electrical signal through intervening signal lines within a printed circuit board.

A transmitter on one chip impresses an electrical signal on one of its pads, and a receiver on the other chip detects the signal coupled to the corresponding one of its pads. Although proximity communication promises much higher input/output (I/O) density and lower power, detecting signals over proximity communication is a challenge. Signals coupled onto the plates of the receiving chip can be very small, on the order of tens of millivolts, for example 50 mV. A typical 1σ deviation for the offset in the receivers is typically about 5 mV. In a system with one hundred such receivers, to achieve 99% reliability requires a 4σ range, which is 20 mV, so 40% of the signal is lost to offset. To achieve even these offsets, the input transistors of the receivers need to be very large because offset scales as $$\frac{1}{\sqrt{length \times width}}$$

of the channel of the input transistor. The large input transistors require a large tail current in the amplifier to achieve sufficient amplifier gain and also reduce amount of signal $V_{RX}$ seen at the receiver input because the gate capacitance $C_g$ acts as a capacitive voltage divider with the coupling capacitance $C_c$ and the stray capacitance $C_{stray}$ according to $$\Delta V_{RX} = \Delta V_{TX} \frac{C_c}{C_c + C_{stray} + C_g}.$$

With capacitively or inductively coupled proximity communication systems, the receive nodes 26, 28 should be actively biased at appropriate DC levels. However, prior offset cancellation schemes have added capacitance to the sensitive nodes in the proximity channel, thereby loading the sensitive receive amplifiers. They have also required dynamically refreshed nodes, thereby introducing pulsed operation and complex timing problems.

Previous schemes of offset biasing using additional capacitance have excessively loaded critical receiver nodes such as the internal or input nodes of the amplifier. The added load on the internal nodes reduces the performance of the amplifier and the added load on the input node increases the stray capacitance $C_{stray}$ and thus reduces the amount of signal receive through the voltage division above.

Better schemes for mitigating the effect of the receiver offset should increase the sensitivity of the receivers and the performance of the proximity communication system over the conventional offset biasing techniques.

SUMMARY

Embodiments of the present invention provide a system that cancels voltage offset on the floating input to an amplifier. The apparatus and method of the invention are particularly useful for receiver inputs on a proximity communication (PxC) system in which data signals are coupled between chips by capacitive or inductive coupling circuits formed jointly in surfaces of the two chips.

In some embodiments, the floating node is connected to a predetermined potential through a large resistive element. For example, the resistance is large enough that the product of the resistance and a parasitic or other capacitance associated with the floating node is greater than the run length for balanced DC coding but less than an effective open connection. Exemplary values of the resistance are greater than 1 gigaohm and less than 1000 gigaohm.

In some embodiments, the resistive element may be a metal-oxide-semiconductor (MOS) transistor having one electrode connected to the floating node and the remaining electrodes connected to one or more predetermined voltages. In particular embodiments, the source or drain is connected to the floating node and the remaining electrodes including the other of the source and drain and the gate and possibly the body are tied together and connected to the predetermined potential.

In some embodiments, a non-linear resistance is connected between the input and output of the receiver in a negative feedback arrangement with a negative output fed back to a positive input and vice versa such that the output provides a reference potential for the input. The non-linear resistance may be a MOS transistor with its source connected to the input and the remaining electrodes connected to the inverted output.

In some embodiments including a plurality of PxC communication channels and associated receivers, a plurality of bias voltages are distributed to all the receivers and one or more multiplexers select one or a pair of the voltages for application to one or two inputs to the receiver.

In some embodiments, an output voltage of the receiver with a floating input node is fed back to the input through feedback circuitry and a large resistive element. The feedback circuitry may directly connect the large resistive element between the output and input. An embodiment of the feedback resistive element is MOS transistor having one principal current electrode connected to the input and its remaining electrodes connected to the output.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

DC biasing of DC-isolated amplifier inputs to compensate for offset can be advantageously achieved by through a large resistance. As illustrated in the electrical schematic of FIG. 3, the floating input nodes 26, 28 of the differential inputs of the differential amplifier 16 are connected through respective resistive elements 40, 42 to respective bias voltages in+bias and in−bias. The resistive elements 40, 42 have high resistance, for example, at least one gigaohm ($10^9$ ohms). The value of the resistance should be limited to a reasonable effective resistance, for example, no more than 1000 gigaohm. A more general minimum value of the resistance is described below by relating a product of the resistance and a parasitic capacitance on the input node to a maximum time period over which the data signal must be DC balanced.

The large resistance shields the capacitive load of the offset cancellation circuitry from the sensitive receiver input nodes 26, 28. The large value of resistance causes the offset cancellation path to have a large time constant. However, because the offset voltage for a given receiver is fixed, the offset cancellation voltage does not need to change rapidly and the long time constant does not severely impact performance.

The value of the bias voltages should be chosen based on the high gain region and compliance range of the amplifier.

Figure 1:
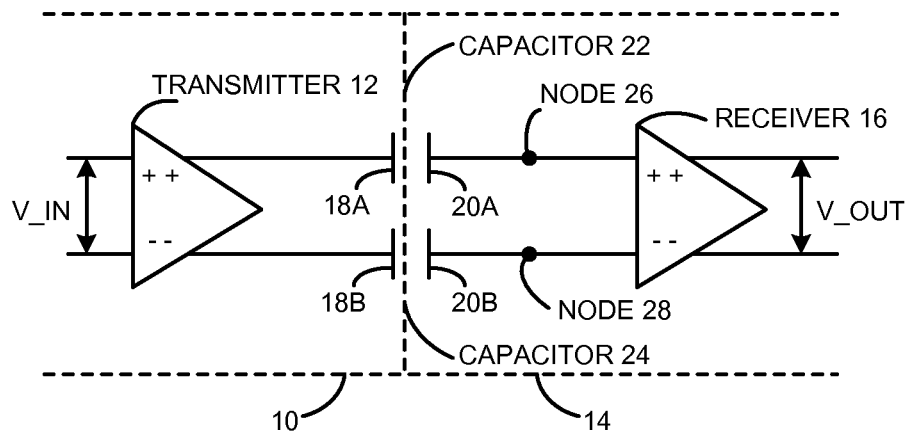
FIG. 1 is an electrical schematic diagram of a capacitively coupled differential proximity communication channel.
Figure 2:
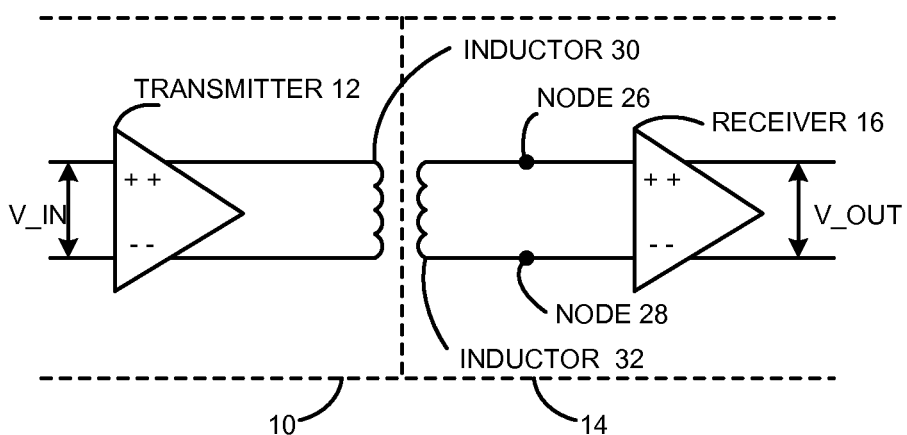
FIG. 2 is an electrical schematic diagram of an inductively coupled differential proximity communication channel.
Figure 3:
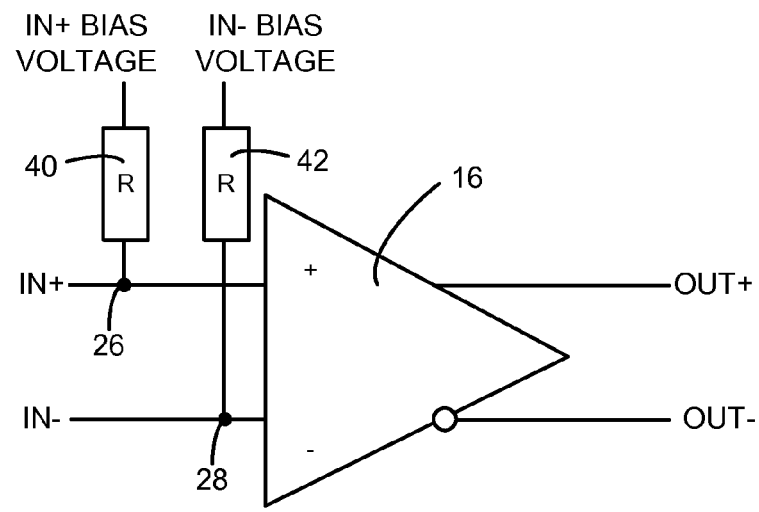
FIG. 3 is an electrical schematic diagram of an offset cancellation circuit including large biasing resistance in accordance with a first general embodiment of the present invention.

The differential receiver 16 of FIG. 3 may have its inputs connected to the two coupling capacitors 22, 24 of the capacitively coupled PxC system of FIG. 1 or to the one receiving inductor 32 of the inductively coupled PxC system of FIG. 2. The invention can be extended to unipolar PxC communication systems in which a single capacitor supports the PxC channel or a receiving inductor grounded on one end is connected on its other end to the input of a unipolar amplifier. However, the invention may be more broadly applied to other amplifiers having floating input nodes.

The resistive elements may be implemented in a number of conventional ways. Load resistors are conventionally implemented in integrated circuits by a long and narrow channel formed in a polysilicon layer. However, for the large bias resistances required for high-impedance inputs of communication receivers, polysilicon resistors occupy an excessively large area of the chip. In MOS integrated circuits, the large resistances can be effectively achieved by a mostly off MOS transistor, as described by Schauer and Hopkins, two of the present inventors, in U.S. patent application Ser. No. 11/651, 221, filed Jan. 5, 2007 and incorporated herein by reference. For example, as illustrated in the electrical schematic diagram of FIG. 4, an NMOS transistor 50 is connected between a biasing voltage $V_{BIAS}$ and a floating node 52 positioned between a PxC coupling capacitor 54 driven by a transmitting inventor 56 on one chip and a receiving inverter 58 on the other chip. The inverters 56, 58 are formed by a pair of PMOS and NMOS transistors and may be the transmitter and receiver of a single-sided PxC communication link or form respective output and input of differential transmitter and receiver. In a differential link, the receiver typically comprises a MOS differential pair with current tail and load resistance as the input stage.

Figure 5:
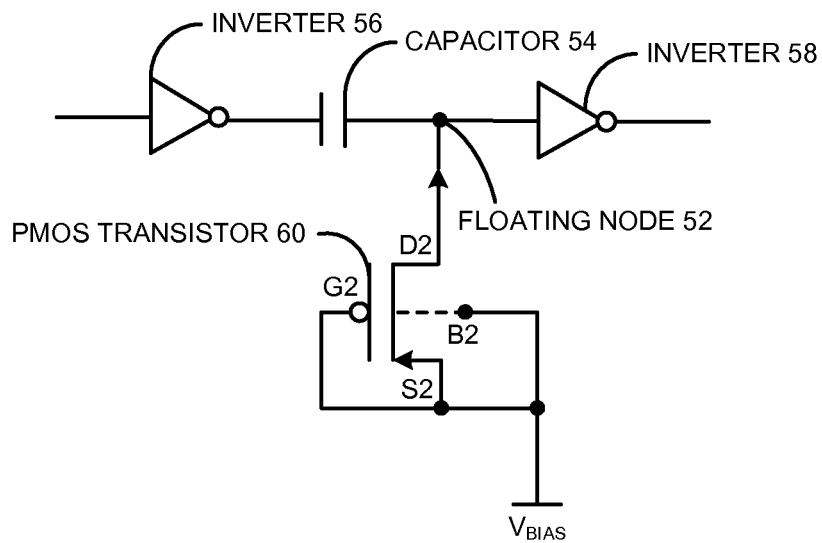
FIG. 5 is an electrical schematic diagram of an offset cancellation circuit including a PMOS transistor as a biasing resistance in accordance with an embodiment of the present invention.

The NMOS transistor 50 should be considered as a four-terminal device, having a source S1, a drain D1, a gate G1, and a body B1, which may be the silicon well in which the NMOS transistor 50 is formed. In one embodiment, the drain D1 is connected to the floating node 52 at the input to the receiving inverter 58. In this embodiment, the source S1, gate G1, and body B1 are tied together and connected to the bias voltage $V_{BIAS}$ chosen to compensate for the offset voltage of the inverter 58. The so configured NMOS transistor 50 is turned off and presents a large resistance between the bias voltage $V_{BIAS}$ and the floating node 52. In another example, illustrated in the electrical schematic diagram of FIG. 5, a PMOS transistor 60 has its drain D2 connected to the floating node 52 and its source S2, its gate G2, and its body B2 tied together and connected to the bias voltage $V_{BIAS}$, thereby forming an highly resistive off transistor between the bias voltage $V_{BIAS}$ and the floating node 52. Alternative configurations include connecting any one of the four terminals of the NMOS or PMOS transistor 50, 60 to the floating node 52 and the connecting the remaining three terminals to the bias voltage $V_{BIAS}$. Yet further alternatives include separate bias voltages for the three terminals away from the floating node 52 which are nonetheless chosen to leave the transistor nearly off and providing high resistance paths to the different bias voltages.

Figure 4:
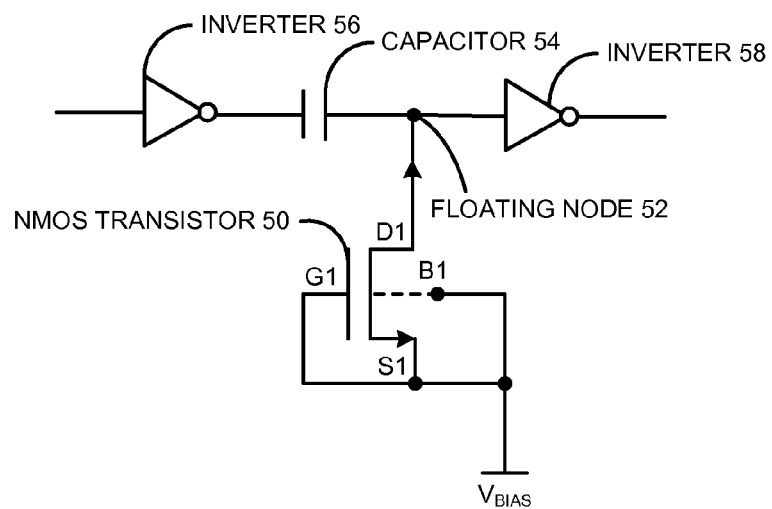
FIG. 4 is an electrical schematic diagram of an offset cancellation circuit including an NMOS transistor as a biasing resistance in accordance with an embodiment of the present invention.

In operation, as explained for the embodiment of FIG. 4, the small leakage current through the off transistor 50 will gradually charge the floating node 52 towards the bias voltage $V_{BIAS}$. The time constant for the charging can be controlled according the width and length of the transistor 50 but should be much longer than data rate through the proximity communication channel. The leakage current is typically much smaller than a typically conducting current when the transistor 50 is on, which ensures that the biasing is performed with low power.

An NMOS biasing transistor is preferably used when the biasing voltage $V_{BIAS}$ is near ground and a PMOS biasing transistor is preferably used when the biasing voltage $V_{BIAS}$ is near a power supply voltage, such as $V_{DD}$. However, with proper design either an NMOS or a PMOS transistor can be used for any biasing voltage between ground and $V_{DD}$.

In one design embodiment, the bias voltage $V_{BIAS}$ is chosen to be approximately the average of the high and low voltages of the data signal being coupled across the PxC capacitor to the floating node 52.

The configuration of FIG. 3 allows each floating node of each receiver 16 to be separately biased to the appropriate value for that receiver input. However, this design does not take advantage of the capacitance-shielding properties of the large resistances. Also, if there are a large number of receivers on a chip to allow high-bandwidth proximity communication, it would be difficult to route the individual bias signals to the many receivers.

Figure 6:
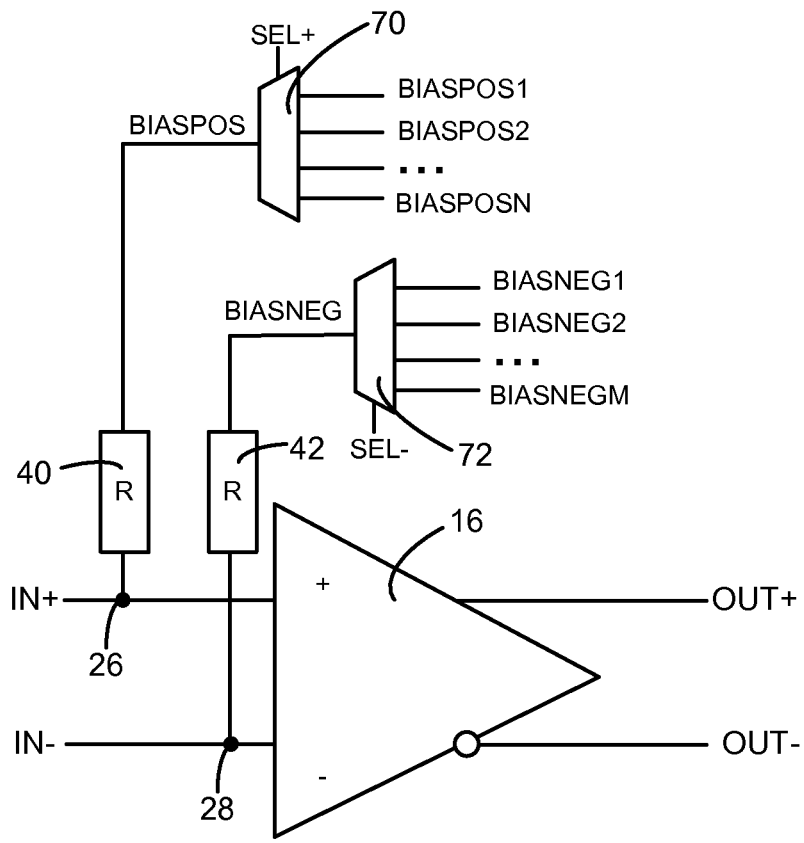
FIG. 6 is an electrical schematic diagram of an offset cancellation circuit including selection of distributed biasing voltages in accordance with an embodiment of the present invention.

In another design, the same set of bias voltage are distributed via bias buses to all receivers and one or a pair of these voltages are selected locally for the receiver inputs. As illustrated in the electrical schematic diagram of FIG. 6 for another embodiment of the invention, N positive bias voltages biasPos1, biasPos2, . . . biasPosN are routed to a positive multiplexer 70 and a positive select signal sel+ selects of them to be output as a positive biasing signal biasPos to the first floating node 26 through the first resistive element 40. Similarly, M negative bias voltages biasNeg1, biasNeg2, . . . biasNegM are routed to a negative multiplexer 72 and a negative select signal sel− selects one of them to be output as a negative biasing signal biasNeg to the second floating node 28 through the second resistive element 42.

The selection of the two sets of bias voltages may take into account that the value of the difference between the two differential inputs is more important than the values of each of them. By careful selection of both sets, a small range of potential offsets can be covered with fine resolution. For example, as summarized in TABLE 1, if the nominal desired bias voltage is 1.80V, the listed bias voltages provide up to 24 mV of offset in 1 mV steps with only nine different voltages needing to be distributed to the many receivers across the chip.

TABLE 1

| i | biasPos_i (V) | biasNeg_i (V) |
|---|---|---|
| 1 | 1.72 | 1.80 |
| 2 | 1.77 | 1.81 |
| 3 | 1.82 | 1.82 |
| 4 | 1.87 | 1.83 |
| 5 | 1.92 | 1.84 |

Also, because the bias lines draw minute amounts of current due to the large biasing resistances, the assorted biases voltages can be simply and economically generated and distributed. The multiplexed design has the advantage that the load from the multiplexers 70, 72 is masked by the large resistances 40, 42. Furthermore, the receiver design for a large PxC array is regular since the same set of bias voltages are distributed to all receivers in the array. However, a disadvantage is that the limited number of selectable biasing voltages may not be able to completely negate the offset of a particular receiver.

Figure 7:
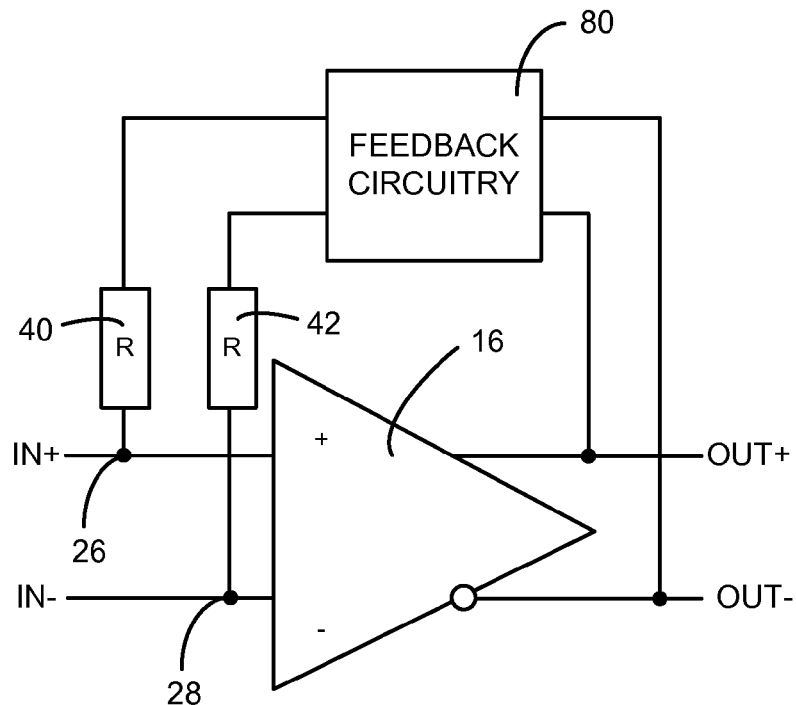
FIG. 7 is an electrical schematic diagram of an offset cancellation circuit including feedback circuitry around the receiver in accordance with an embodiment of the present invention.

Another embodiment of correcting the offset voltage, as illustrated in the schematic circuit diagram of FIG. 7, includes feedback circuitry 80 connected between the outputs out+, out− of the receiver amplifier 16 and its inputs in+, in− through the large resistances 40, 42 in a negative feedback configuration. That is, the inverted output is fed back to the input. The bias voltages could be determined, for example, by averaging the out+ and out− signals over a long time as long the amplifier is linear, that is, the output signals out+ and out− have not saturated. The feedback embodiment reduces the offset by the gain of the receiver amplifier 16. It has the advantage that the load of the bias-setting and feedback devices in the feedback circuitry 80 is masked by the large resistances 40, 42.

The resistive elements 40, 42 need to have very high resistance over the full range of output voltages.

In a simple implementation, the feedback circuitry 80 is a direct connection, for example, resistive element 40 is directly connected between input in+ and output out−.

The active pass gate resistor can be used as well for the resistive elements 40, 42 of the FIGS. 3 and 7. Alternatively, the resistive elements may be implemented as reverse-biased diodes. For instance, a diode can be used having an n-well to p+ diffusion or a p-well to n+ diffusion in which the diffusion connects to the input side the well connects to the output of the receiver amplifier 16.

Both types of embodiments entail setting an average DC voltage of the inputs to a receiver on an input node that is otherwise DC isolated. As a result, the transmitted signal needs to have a constant average value over the time constant of the biasing circuitry. The simplest way to achieve a constant average value of the input signal is to ensure that the transmitted signal is DC balanced, that is, over a period less than the time constant, the data signal has as many positive portions as negative portions or at least as many 0 data signals as 1 data signals. The time constant in this case is referred to as the DC-imbalanced time of the data signal over which time period the data signal is DC balanced. Many commonly used data encoding schemes such as 8b10b or Manchester encoding address this limitation. Although DC balancing is not required for all embodiments of the invention, for some simpler biasing arrangements it provides advantages and a degree of maximum unbalance may be needed. Typically a parasitic capacitance exists between the floating input nodes 26, 28 and ground or the power supply lines on the receive integrated circuit chip 14 and the total parasitic capacitance can be assigned a value of $C_P$. The product of the parasitic capacitance $C_P$ and the resistance R of the associated biasing resistive element 40, 42 of the invention determines a time constant of the input node 26, 28. The previously described minimum resistance of 1 gigaohm for the resistive elements 40, 42 can be generalized to the minimum resistance for which the product of the resistance and the parasitic capacitance of that node 26, 28 is greater than the DC-imbalanced time. As a result, the input bias voltages do not affect the voltage fluctuations associated with the data signal but do affect offset drifts on the floating nodes 26, 28 occurring over time periods much longer than the DC-imbalanced time.

Although the embodiments of FIGS. 3 and 7 seem distinctly different, they share a common feature of connecting the floating input node through a large resistance to a predetermined and constant voltage. In the case of FIG. 3, the constant voltage is the in+bias or in−bias voltage of the power supply.

In the case of FIG. 7, the predetermined and substantially constant voltage is the output voltage out+ or out− time averaged over the time constant of the feedback resistance and the biasing circuitry and which output voltage averages to the high and low values of the data signal over the DC-imbalanced time. Because of DC balance over the same time constant, the feedback voltage is substantially constant.

Figure 8:
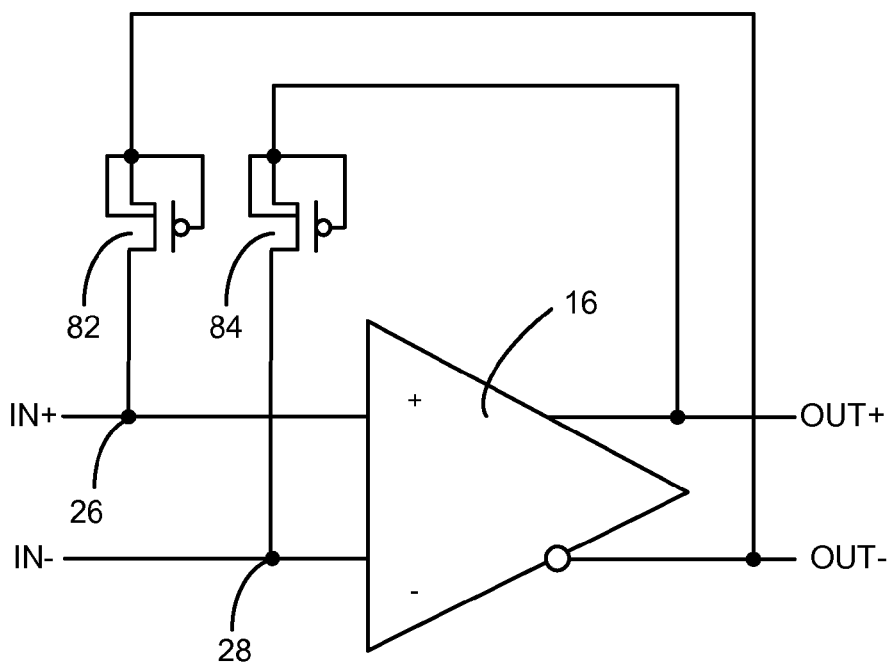
FIG. 8 is an electrical schematic diagram of an implementation of the offset cancellation circuit of FIG. 7 utilizing MOS transistors as non-linear feedback resistors in accordance with an embodiment of the present invention.

An alternative implementation of the feedback embodiment is illustrated in the schematic circuit diagram of FIG. 8. Large non-linear resistive elements are implemented as PMOS transistors 82, 84, which are directly connected in a negative feedback configuration between the respective inputs in+, in− and outputs out−, out+ of the differential amplifier 16 and which act as leaking transistors. The feedback is negative feedback with the negative output being feed back to the positive input and vice versa. The sources of the transistors 82, 84 are connected to the floating inputs while their drains sources, gates, and wells or other electrodes are connected to the output nodes. The resistance of a transistor operating the sub-threshold region is highly non-linear due to the exponential relationship of sub-threshold current to gate-source voltage. The non-linearity of the resistance is beneficial because it relaxes the need to have a perfectly DC-balanced input signal by providing a much lower resistance for one of the digital input signal levels. The much lower resistance causes the corresponding digital level to dominantly set the steady-state differential voltage regardless of the duty cycle of the input signal. Therefore, the input requirement for a non-linear biasing resistor is that the input must have a certain duty cycle. Alternatively stated, there must be a transition on the input only every so often. This non-linear benefit is enhanced by placing the leaking device in the feedback loop because the gate source voltage of the feedback device is increased by the gain of the amplifier. The linear increased in the gate source voltage with amplifier gain results in an exponential increase in the feedback current non-linearity and a relaxing of the duty-cycle constraint by increasing the ratio of the high to low resistances. That is, the data signal in this embodiment does not need to be DC balanced.

Figure 9:
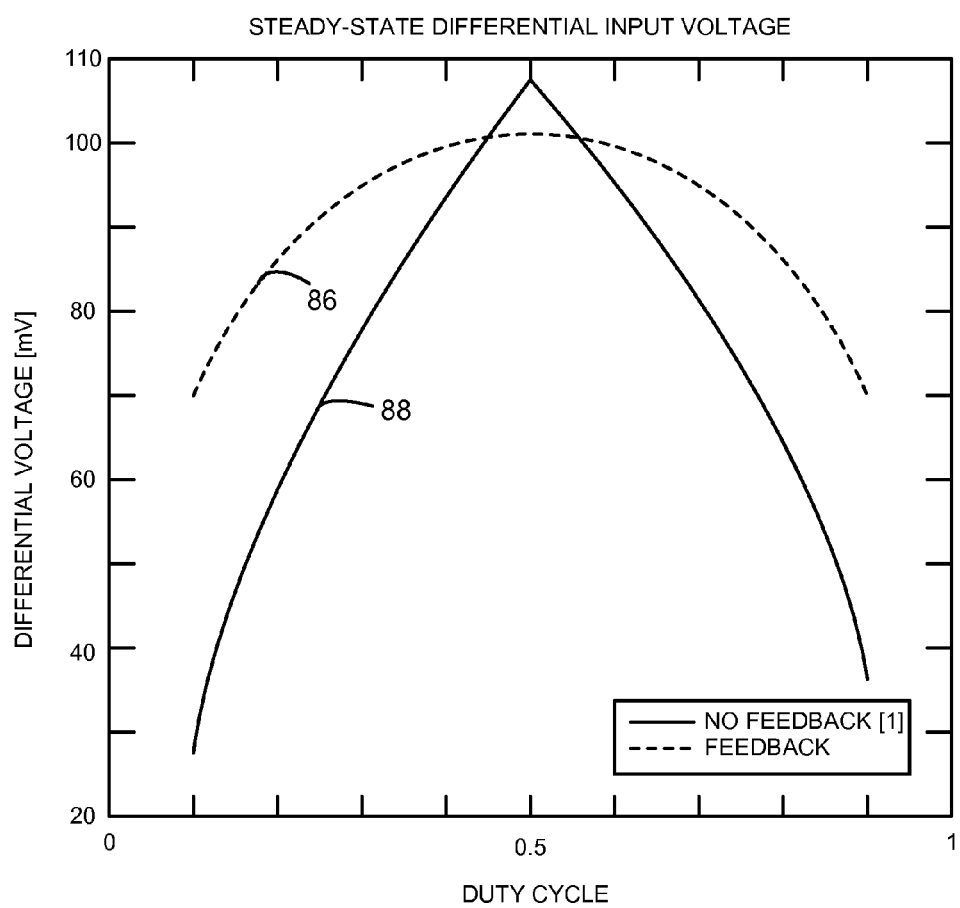
FIG. 9 is graph illustrating the dependence of the differential input voltage on the duty cycle of a signal in the circuit of FIG. 8.

The graph of FIG. 9 plots the result of a simulation of the steady-state different input voltage of the receiver as a function of the duty cycle. Plot 86 shows the results for a receiver having its inputs connected through leaky transistors to predetermined voltages. Plot 88 shows the results with the negative feedback of FIG. 8 from the outputs to the inputs. The differential input voltage with feedback remains more linear and larger over a wider range of duty cycle than without feedback. Under ideal conditions of the duty cycle being 0.50, the negative feedback reduces the input signal slightly. Accordingly, the implementation of FIG. 3 without feedback is better in this range.

Further simulations involving eye patterns and their closing under unfavorable conditions show that without feedback the input eye collapses at extreme duty cycles but that with feedback the eye patterns remain fairly constant.

The incorporation of offset cancellation in a proximity communication channel allows the performance of the proximity receiver to be increased by a reduction in side of the input devices. Reducing the size of the input devices decreases the energy-delay produce of the receiver amplifiers so that their energy, delay, or both can be improved. The performance of the proximity receivers is one of the principal limiting factors in the performance of a proximity communication channel. Further, increasing the performance and sensitivity of the proximity receivers also increases tolerances in alignment between chips and therefore simplifies packaging.

The described embodiments of cancelling offset voltages have several advantages over other schemes. Because the offset cancelation can be done continuously and asynchronously and is thus simpler than related schemes. The large resistances involved in the described offset cancellation shields the sensitive input nodes of the receiver from loading that may be imposed by alternative offset cancellation schemes. The reduced loading further improves the performance of the proximity channel.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An amplifier circuit, comprising
   an amplifier configure to receive a communication data signal on a floating input node, amplify the communication data signal and output the communication signal on an output node;
   a resistive element having a resistance of at least one gigaohm and no more than 1000 gigaohm connected between the input node and a bias node; and
   a multiplexer configured to connect the bias node to one of a set of bias voltages, thereby enabling selection of different bias voltages to facilitate cancelling different voltage offsets.

2. The amplifier circuit of claim 1, wherein the resistive element is a MOS transistor having one of its electrodes connected to the input node and at least two of its remaining electrodes connected to the bias node.

3. The amplifier circuit of claim 1,
   wherein the amplifier is a differential amplifier having a positive input coupled to a positive bias node, and a negative input coupled to a negative bias node;
   wherein the multiplexer comprises a positive multiplexer and a negative multiplexer;
   wherein the positive multiplexer is configured to connect the positive bias node to one of a set of positive bias voltages; and
   wherein the negative multiplexer is configured to connect the negative bias node to one of a set of negative bias voltages.

4. A proximity communication system, comprising:
   a plurality of proximity communication channels coupled between juxtaposed first and second chips through respective transmitter elements formed in the first chip and receive elements formed in the second chips and including a plurality of amplifiers having respective inputs connected to respective ones of the receive elements, wherein the transmit and receive elements are selected from capacitive and inductive coupling elements such that the inputs are floating with respect to the corresponding transmit elements; and
   a plurality of resistive elements connected between respective inputs and respective bias nodes and having resistances of at least one gigaohm and less than 1000 gigagohm; and
   a plurality of multiplexers, wherein each multiplexer is coupled to a respective bias node and is configured connect the bias node to one of a set of bias voltages, thereby enabling selection of different bias voltages to facilitate cancelling different voltage offsets.

5. The system of claim 4, wherein the resistive elements comprise MOS transistors each having one electrode connected to a respective input and at least two other electrodes connected to the respective bias node.

6. The system of claim 4, wherein the amplifiers are differential amplifiers, wherein each differential amplifier has a positive input coupled to a positive bias node, and a negative input coupled to a negative bias node;
   wherein the each multiplexer comprises a positive multiplexer and a negative multiplexer;
   wherein the positive multiplexer is configured to connect a positive bias node for an associated amplifier to one of a set of positive bias voltages; and
   wherein the negative multiplexer is configured to connect a negative bias node for the associated amplifier to one of a set of negative bias voltages.

* * * * *

UNITED STATES PATENT AND TRADEMARK OFFICE
CERTIFICATE OF CORRECTION

| | | |
|---|---|---|
| PATENT NO. | : 8,818,271 B2 | Page 1 of 1 |
| APPLICATION NO. | : 14/101015 | |
| DATED | : August 26, 2014 | |
| INVENTOR(S) | : Schauer et al. | |

It is certified that error appears in the above-identified patent and that said Letters Patent is hereby corrected as shown below:

In the Specification

In column 1, line 7, after "to," delete "pending".

In the Claims

In column 10, line 33, in Claim 4, delete "gigagohm;" and insert -- gigaohm; --, therefor.

In column 10, line 35, in Claim 4, delete "configured" and insert -- configured to --, therefor.

Signed and Sealed this
Tenth Day of March, 2015

Michelle K. Lee
*Deputy Director of the United States Patent and Trademark Office*